US008225151B2

(12) United States Patent
Rajeev et al.

(10) Patent No.: US 8,225,151 B2
(45) Date of Patent: Jul. 17, 2012

(54) INTEGRATED CIRCUIT AND TEST METHOD

(75) Inventors: Kumar Rajeev, Singapore (SG); Renaud F. H. Gelin, San Diego, CA (US); Kar Meng Thong, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 886 days.

(21) Appl. No.: 11/916,859

(22) PCT Filed: Jun. 13, 2005

(86) PCT No.: PCT/IB2005/001635

§ 371 (c)(1), (2), (4) Date: Jul. 1, 2008

(87) PCT Pub. No.: WO2006/134411

PCT Pub. Date: Dec. 21, 2006

(65) Prior Publication Data

US 2008/0282121 A1 Nov. 13, 2008

(51) Int. Cl.
*G11C 29/44* (2006.01)
*G11C 29/54* (2006.01)

(52) U.S. Cl. ........................................ 714/719; 714/733

(58) Field of Classification Search ........................ None
See application file for complete search history.

(56) References Cited

U.S. PATENT DOCUMENTS 5,737,340 A 4/1998 Tamarapalli et al.
5,784,382 A 7/1998 Byers et al.
5,912,901 A 6/1999 Adams et al.
5,937,154 A 8/1999 Tegethoff
5,961,653 A * 10/1999 Kalter et al. ...................... 714/7
5,991,898 A 11/1999 Rajski et al.
5,991,909 A 11/1999 Rajski et al.
5,995,731 A 11/1999 Crouch et al.
6,070,261 A 5/2000 Tamarapalli et al.
6,321,320 B1 11/2001 Fleischman et al.
6,324,657 B1 * 11/2001 Fister et al. ..................... 714/42
6,374,370 B1 4/2002 Bockhaus et al.
6,625,769 B1 9/2003 Huott et al.
6,681,359 B1 1/2004 Au et al.
6,738,938 B2 5/2004 Nadeau-Dostie et al.
6,873,735 B1 * 3/2005 Aleksic et al. ................ 382/233

(Continued)

OTHER PUBLICATIONS

International Search Report, PCT, International Application No. PCT/IB2005/001635, International Filing Date Jun. 13, 2005, 3 pages.

*Primary Examiner* — Jeffrey A Gaffin
*Assistant Examiner* — Dipakkumar Gandhi
(74) *Attorney, Agent, or Firm* — Dicke, Billig & Czaja, PLLC

(57) ABSTRACT

An integrated circuit test controller and method defining a number N of failure events, applying the test to an integrated circuit under test by applying a predetermined sequence of input and output operations according to a test algorithm. Output data is compared to expected data, and a failure signal is generated when the output data does not correspond to the expected data. If a failure signal is generated, failure data related to the failure event is stored in a failure data register set. If the number N of failure events has been reached or if there are no more tests left, the content of the data failure register set is read out through a parallel failure data output port.

11 Claims, 6 Drawing Sheets

U.S. PATENT DOCUMENTS 6,961,871 B2 * 11/2005 Danialy et al. .................. 714/30
7,219,275 B2 * 5/2007 Chang et al. .................. 714/718
7,237,153 B2 6/2007 Di Ronza et al.
2002/0116675 A1 * 8/2002 Gangl et al. .................. 714/732
2003/0204782 A1 * 10/2003 Schutt et al. .................... 714/30
2003/0226073 A1 12/2003 Nadeau-Dostie et al.
2006/0238032 A1 * 10/2006 Nitta ............................... 307/64
2006/0242499 A1 * 10/2006 Volz .............................. 714/724

* cited by examiner 20
10
26
R/W Control
R/W
24
28
General Control
address generator
address
30
data generator
Data Input
32
expected
compare
Comparator
Data Output
failure
36
failure data register set
Memory
38
failure
34
event counter
Hold

| | failure address | failure data | failure state |
|---|---|---|---|
| 0 | 0 000 10 | 000 100 | 1100 |
| 1 | 0 001 10 | 000 100 | 1100 |
| 2 | 1 100 00 | 000 100 | 1100 |
| 3 | 1 100 01 | 000 100 | 1100 |
| 4 | | | |
| 5 | | | |
| 6 | | | |
| 7 | | | |
| 8 | | | |
| ⋮ | ⋮ | ⋮ | ⋮ |
| 25,5 | | | |

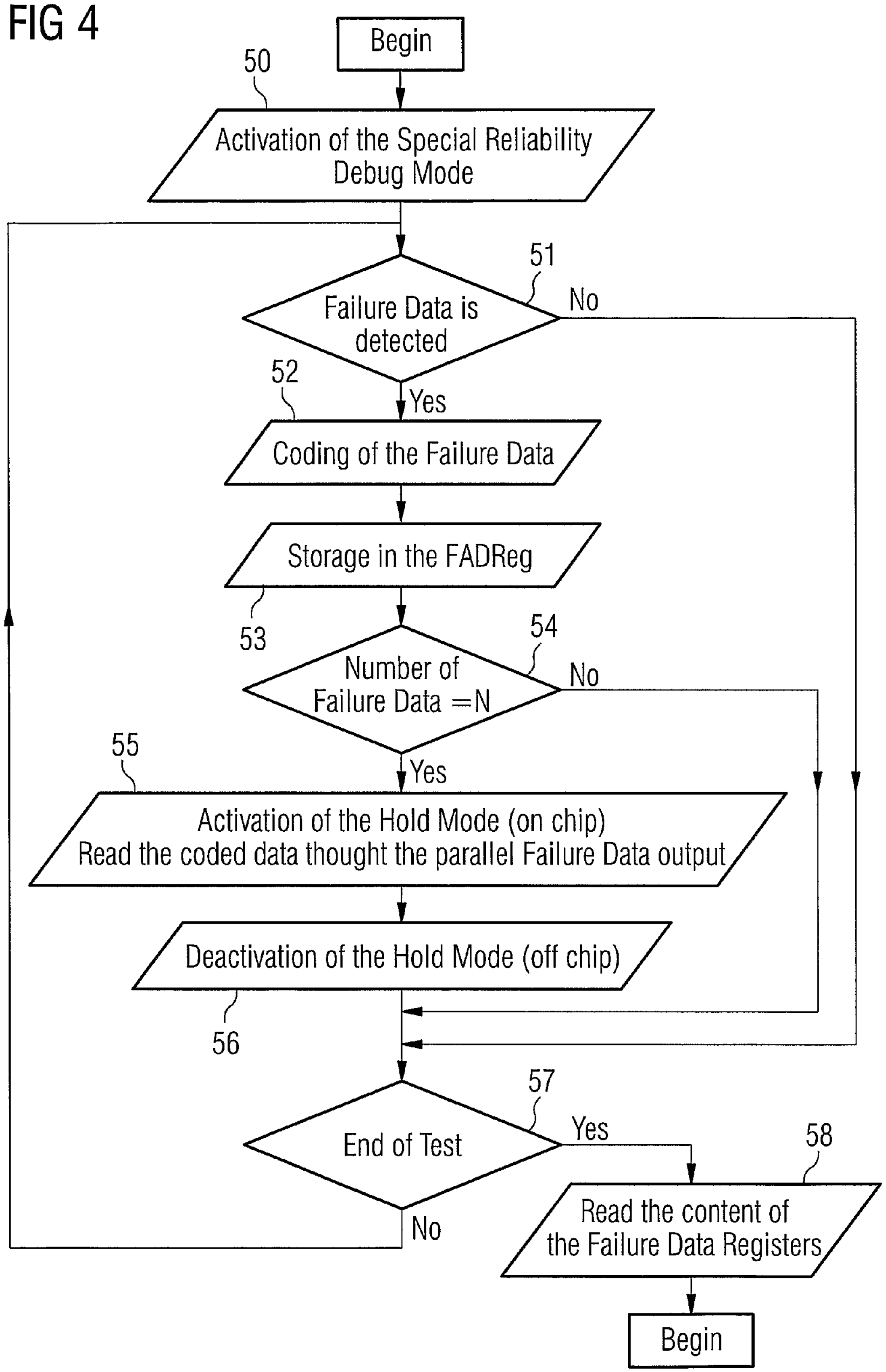
FIG 4
Begin
50
Activation of the Special Reliability Debug Mode
51
Failure Data is detected
No
52
Yes
Coding of the Failure Data
Storage in the FADReg
53
54
Number of Failure Data =N
No
55
Yes
Activation of the Hold Mode (on chip)
Read the coded data thought the parallel Failure Data output
Deactivation of the Hold Mode (off chip)
56
57
End of Test
Yes
58
No
Read the content of the Failure Data Registers
Begin 60
BIST CONTROLLER
Coding Block
62
61
Mbist_nrst
Mbist_ debug
Mbist_ control
Mbist clock
Mbist holdn
i
Mem_DI[0:i],
Mem_CSB,
Mem_RWB,
Mem_OEB,
Mem_WB[0:i],
Mem_A[0:i],
Mem clock
BIST Wrapper
BIST LOGIC
36
FADReg
Coded DATA[0:k]
FAD rstb
FAD clk
FAD en
Address pointer
Tselect
1
0
63
64
20'
38
FAD[0:n]
FADReg_full
39
Mbist fail
Mbist done
i
Mem_DO[0:i],
BYPASS LOGIC
65
66
10'
MEMORY (SRAM)
i
Test_DO[0:i],

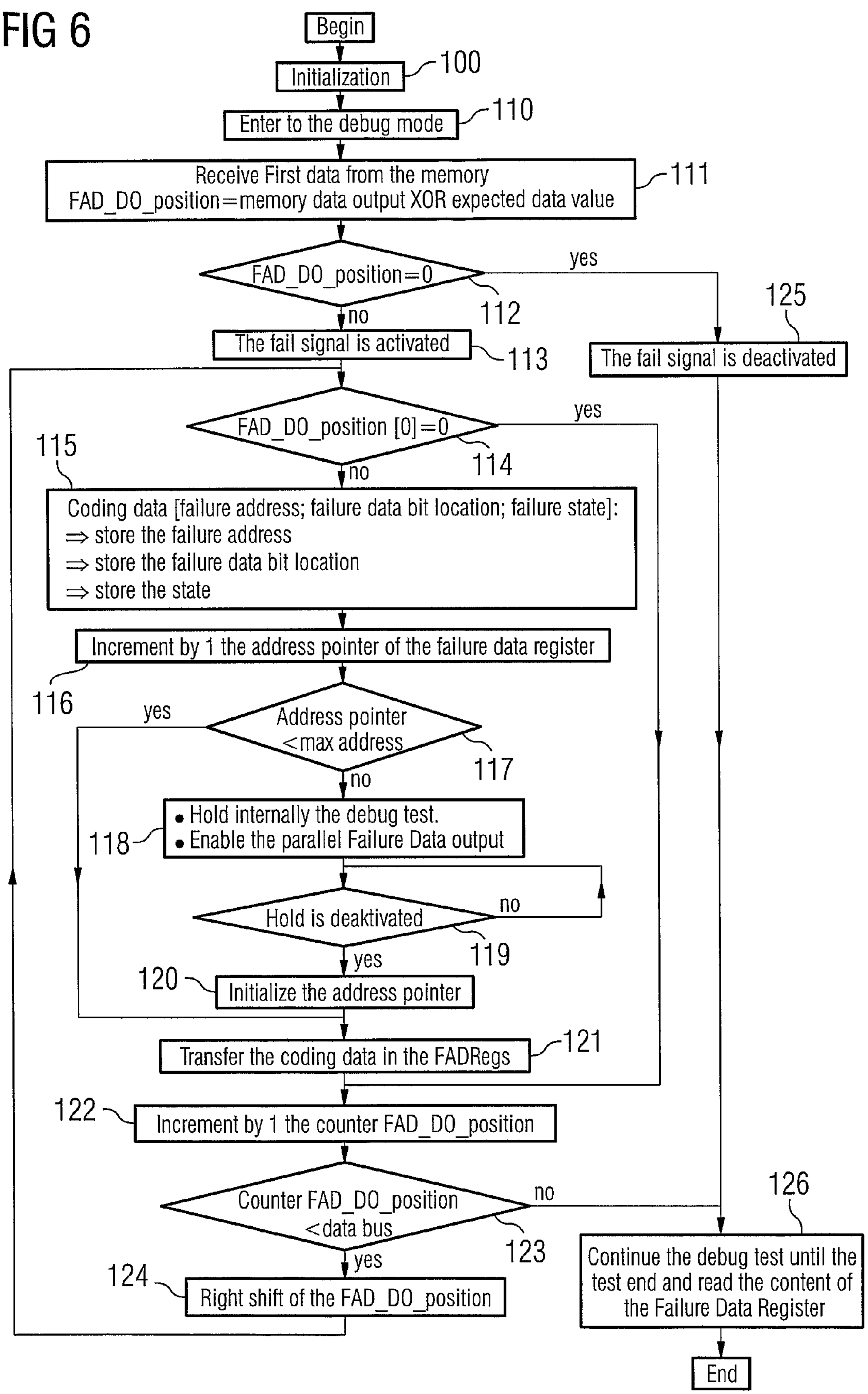
FIG 6
Begin
Initialization
100
Enter to the debug mode
110
Receive First data from the memory
FAD_DO_position=memory data output XOR expected data value
111
FAD_DO_position=0
yes
112
no
The fail signal is activated
113
125
The fail signal is deactivated
FAD_DO_position [0]=0
yes
114
no
115
Coding data [failure address; failure data bit location; failure state]:
⇒ store the failure address
⇒ store the failure data bit location
⇒ store the state
Increment by 1 the address pointer of the failure data register
116
Address pointer
<max address
yes
117
no
• Hold internally the debug test.
• Enable the parallel Failure Data output
118
Hold is deaktivated
no
119
yes
120
Initialize the address pointer
Transfer the coding data in the FADRegs
121
122
Increment by 1 the counter FAD_DO_position
Counter FAD_DO_position
<data bus
no
123
yes
124
Right shift of the FAD_DO_position
126
Continue the debug test until the test end and read the content of the Failure Data Register
End

INTEGRATED CIRCUIT AND TEST METHOD

CROSS-REFERENCE TO RELATED APPLICATIONS

This Utility patent application is a U.S. National Stage filing under 35 U.S.C. §371 of PCT/IB2005/001635, filed Jun. 13, 2005, incorporated by reference herein.

BACKGROUND

U.S. Pat. No. 5,737,340, U.S. Pat. No. 6,681,359 B1, U.S. Pat. No. 6,070,261, U.S. Pat. No. 5,737,340, U.S. Pat. No. 5,991,909, U.S. Pat. No. 5,991,898, U.S. Pat. No. 6,625,769, U.S. Pat. No. 6,738,938 B2 and U.S. Pat. No. 5,995,731 disclose built-in self-test (BIST) apparatus and methods for testing integrated circuits which enable various methods for capturing failure data for a selected failure. A BIST apparatus includes a clock generator which generates a clock signal, and a built-in self-tester, which applies predetermined input data patterns to the integrated circuit in response to the first clock signal. The BIST apparatus further includes a data comparator for comparing output data received from the integrated circuit with expected output data. The data comparator detects a failure within the integrated circuit when the output data received from the integrated circuit differs from the expected output data. The BIST apparatus also includes a clock controller that disables the first clock signal in response to the detection of a selected occurrence of a failure. By enabling testing of the integrated circuit to be halted upon the occurrence of a selected failure, failure analysis of the integrated circuit is enhanced.

This prior art suggests that the method can be used to capture all failure data of a memory by iteratively applying the method. However, collecting information in this manner can be extremely time consuming.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 3 illustrates a failure data register in the memory test controller of FIG. 1.

FIG. 4 is a flow diagram of the method according to an embodiment of the present invention.

FIG. 6 is a flow diagram of an exemplary method according to embodiments of the present invention.

DETAILED DESCRIPTION

Figure 1:
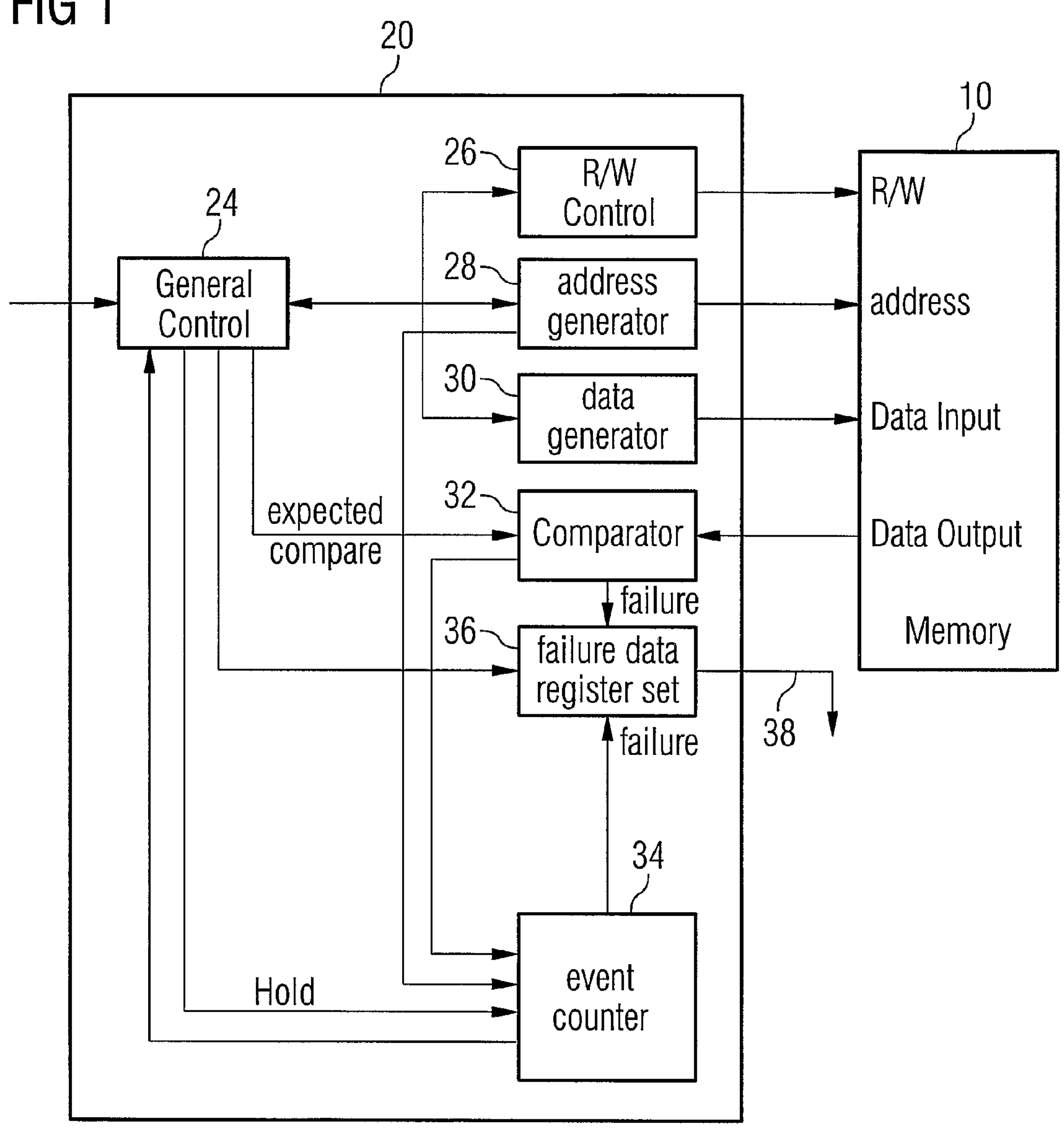
FIG. 1 illustrates a memory test controller architecture according to one embodiment of the present invention.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Embodiments of the disclosed method are applicable for collecting failure information when testing a semiconductor memory. At a first process, an initial state of the test is set. The initial state can be the state at which the last failure occurred, the beginning of an algorithm phase, or the beginning of the algorithm itself. At the next process, a number N of failure events which will occur before applying the stopping criterion is defined. The integrated circuit is then tested by applying a predetermined sequence of input, e.g., write, and output, e.g., read, operations according to a predetermined test algorithm. The next process provides a comparison of the output data to the expected data. A failure signal is generated when the output data does not correspond to the expected data. If a failure signal being generated, encoding the failure data may be provided. The failure data is stored in a failure data register set. When the failure data register set is full, i.e. whether all N registers contain encoded failure entries, or when the predetermined number of failure events has been reached, i.e. whether a stopping criterion is satisfied and can be applied, the content of the data failure register set is read out through a parallel failure data output port.

In some implementations, a hold mode of the integrated circuit under test is activated before the process of reading out the content of the data failure register set. It is then made sure that no new failure data is written into the failure data register set as long as the existing data is not yet entirely evaluated.

A test controller for testing components of an integrated circuit according to embodiments of the invention includes a general control block for interaction with all other blocks as well as with an external tester either directly or through a test access port and for determining input and output operations that are to be performed with the integrated circuit under test. Several interaction blocks such as R/W control blocks, address generator blocks, data generator blocks and comparator blocks for communication with the integrated circuit under test are provided, especially when the circuit under test is a memory.

Embodiments include an event counter is used to count test events, such as "failure" events, of the integrated circuit under test, the event counter counting events until a predetermined number of failure events has been reached. The event counter receives a failure signal from the comparators.

The failure data register set for receiving a number of failure data corresponding to failure events includes a parallel failure data output port for writing the content of the N failure data register set to an external testing device when the predetermined number N of failure events has been reached.

The event counter receives a failure signal from a comparator block when a failure event occurs.

An integrated circuit according to the invention includes such an on-chip test controller.

Exemplary embodiments have a computer program for performing the aforementioned method according to the invention, the computer program being stored on a storage media such as a computer memory or being transmitted with an electric signal. Available data carriers are CD-Roms or DVDs. Such a program can be downloaded a data network such as the Internet to a computer connected thereto.

An exemplary method for collecting failure information when testing a memory includes performing a test of the memory according to a test algorithm, and, while performing the test, counting failure events which occur after a predetermined number of masked events; stopping the test upon occurrence of a stopping criterion which includes one of occurrence of a first failure event, a change of a test operation; a change of a memory column address; a change of a memory row address; a change of a memory bank address; and a change of a test algorithm phase; and storing failure information.

Another embodiment includes a memory test controller for use in an integrated circuit for testing memory. The memory test controller includes an event counter for counting predetermined events and responsive to a stopping criterion signal by generating a freeze signal, the event counter being responsive to an active failure signal for counting failure events; and control logic for controlling memory test operations, the control logic being operable for generating the stopping criterion signal and being responsive to the freeze signal for stopping the test controller test.

One of the benefits of using an embedded test controller is that the clock rate used during the test can be substantially the same as that used during the normal operation of the circuit. Thus, some embodiments detect and diagnose all defects, including those that only manifest themselves at the normal operational clock rate.

Disclosed embodiments enables VLSI tester equipment to make testing, reliability analysis and fusing of embedded memories very simple, especially for big size memories (32K and above). Performing real time testing of the RAM/ROM memories is very simple because the available debug techniques provide data not only for the "stop and go" kind of analysis for each failure, which is difficult to handle in the VLSI testers. Analysis time of Memory (RAM/ROM) is relatively short because the Standard BIST logic provides not only serially scanned out failing data for diagnosis but in a parallel manner for many failures at a time.

Embodiments of the invention doe not only generate a serial stream of 'failing data' but a set of parallel data. This mechanism of implementation provides full byte, its address, and state of the data at "scan_out" port, especially of Mbist architecture logic. This can to be further analyzed externally to find out which particular bit of supplied data is faulty. Each time the BIST logic detects a failure, instead of supplying the failing data at "scan_out" which must be analyzed again, one of the failure data registers is filled with that data. This is to be done in a special mode called "Debug Mode" of the MBIST architecture wherein the data is available.

Disclosed embodiments implement a special Test & Reliability Debug Mode around the BIST logic of the RAM/ROM wrappers which extracts the failure data and stores them in a special format on the chip required by the Reliability/Testing Engineer.

In this mode, the failure data up to 256 (max) is coded into a format and stored into a set of test registers (FADReg, Failure Data Registers). The number 256 is usually the standard size of a tester memory like HRAM. In the rest of this document, the size of the memory—here 256—will be named N. After N failures are detected and stored in the above the registers, the Chip activates Hold mode.

Now, the coded failure data is read out through the parallel FAilure Data Output (FAD[0:nj) by asserting the FADEN (FAilure Data ENable) signal. The purpose of implementing the parallel Failure Data Output is to reduce the analysis time (by more than 50%) of Memory RAM/ROM.

Once the coded failure is read out and stored inside the tester memory, the Reliability/Testing Engineer can analyze the N failure data. Since N failing data is downloaded to external test memory like HRAM, against one failing data in the existing MBIST architecture method, the tester memory can be best utilized and therefore the test time can be reduced tremendously. The Test Engineer can either analyse the N data before doing further testing or shift this data to another big memory for analyzing it later when the Memory test is complete. Hence, the real time testing of the RAM/ROM memories is easier and cost effective with this invention.

After finishing the analysis, Hold mode is deactivated by the Reliability/Testing Engineer and indicated through a Test Pin. At this time, the debug test of Memory restarts from the point where the last failure data was found and continues until the N new failure data and so on. The fact that the Testing Engineer can restart the analysis whenever he wants allows him to have a real time testing of the RAM/ROM memories. At the end of the analysis, the mbist_done Signal goes high and the last set of failure data (<=N) is written out through the parallel Failure Data Output (FAD[0:n]) to obtain the last failure data.

Taking an example of 8 bit address & 16 bit data, for every failure location in the memory, the conventional BIST Controller requires about 37 cycles (assuming 8 bit address, 16 bit data, 4 bit state, and some overhead) to output failing information to the VLSI tester. Hence, with only N cycles of the VLSI tester memory, at most only 8 failure locations can be captured each time that the test program runs. However, with the technique of the invention, each time the test program runs, N failure location information can be captured. Furthermore, when the test program runs again, the next failure location will be captured. This will continue until all the failure locations of the memories are captured.

This will never be possible with the current existing technique as there is no means of remembering the last failure data which was captured when the test program is first run.

Disclosed embodiments provide special debug mode around the BIST logic of the RAM/ROM wrappers. The coded failure data improves the test and reliability analysis of memory (ROM/RAM). The format of the failure data output contains the FAilure Address FAA[0:a], the FAilure Bit Location FABL [0:1] and the FAilure State FAS [0:sj]. The FAilure Address (FAA) is the address where the BIST Controller detects a failure, the FAilure Bit Location (FABL) indicates the location of the bit failure for the specified FAA, and the FAilure State (FAS) specifies the stage where the BIST Controller is during this failure.

The FAilure Data Registers (FADReg) stores the FAilure Data. The number of stored FAilure Data inside the FADReg is equivalent to the Tester Memory size N. Therefore, the FADReg Stores N FAilure Data (FAD) by N. These FAilure Data Registers are composed by a concatenation of flip-flops.

The main goal of the Parallel Failure Data Output (FAD[0:n]) is to improve the analysis time and to simplify the external set-up for capturing the data.

The analysis time of the memory is reduced by 50% at least. The analysis time is decreased by at least two different factors in the invention, namely the parallel failure data Output and the new Debug Mode logic.

FIG. 1 illustrates an example of a test controller 20 connected to an integrated circuit, which is a memory 10 in the illustrated embodiment. The test controller 20 and the integrated circuit under test can be embedded in the same integrated circuit or test controller 20 could reside off-chip. Not all functional connections of the test 20 to the memory 10 are illustrated to simplify the figure. The memory test controller can be shared among several memories 10.

The memory test controller includes several blocks. A general control block 24 interacts with all other blocks as well as with an external tester (not illustrated) either directly or through a test access port. In general, the interaction with the tester is limited to initiating a memory test and collecting failure information. Both operations require setting registers (a group of memory elements) of the test controller to appropriate values and reading registers containing relevant information after the execution of the memory test.

General control block 24 determines the sequence of read and write operations that are to be performed to test the memory. The interaction of the general control block with the R/W control block 26, address generator block 28, data generator block 30 and comparator block 32, as well as the connections between the memory test controller and the memory, are well known in the art and are not discussed here. The discussion is limited to event counter block 34 and its interaction with the other blocks.

Event counter 34 is used to count "masked" events. There are two types of events. A masked event can be a "failure event" or, optionally, a "success event". A failure event occurs when a value output by the memory 10 being tested is different from an expected value. A success event occurs when a value output by the memory 10 is successfully compared with an expected value.

Event counter 34 counts masked events until a predetermined number of events has been reached. At that point, the event counter 34 starts counting failure events until a stopping criterion is satisfied. The stopping criteria according to the invention is explained later.

The event counter is of the type which counts down to 0 from a predetermined value and thereafter counts up until stopped. This avoids the need for a register to store the predetermined value and the comparator for comparing the current count against the predetermined value.

Event counter 34 receives a failure signal from comparator block 32. The counter can count the failure events indicated by an active value of the failure signal. A failure event corresponds to a success event.

The test controller 10 further includes a failure data register 36 which is a set of test registers. The failure data register 36 can be any number of test registers but in certain environments 256 test registers are used. The number 256 is very often the standard size of a test controller memory. The size of the failure data register 36 will be named N in the following.

Event counter 34 receives a stopping criterion signal from the general control block 24. The address, provided by the address generator 28, is used in conjunction with the stopping criterion to stop the counting of failure events. Once the stopping criterion is satisfied, the event counter 34 outputs a Hold signal which is sent to the general control block 24 which, in turn, will stop the controller 20. The controller can be stopped by either configuring memory elements in a hold mode or by the clock applied to the test controller. Several registers of the controller are read to characterize a failure group. The state of the address generator 28 indicates the address of the last failure. The state of the general control block 24 indicates the algorithm phase of that failure. The state of the comparators 32 indicate the bit positions which generated failure events after the masked events. Finally, the event counter 34 indicates the actual number of failure events. When there are several comparators 32, an active failure signal is generated if any of the comparators 32 indicates a failure.

Each of the aforementioned failure related data is coded into a predetermined format and stored in one register of the failure data register set 36. After N failures are detected and stored in the N failure data registers 36, the event counter activates the Hold signal. The general control block 24 then asserts a signal to the failure data register 36. Now, the N failure data set is written via a parallel failure data output 38 to an external testing device which is not illustrated in FIG. 1. The purpose of implementing the parallel failure data output is to reduce the analysis time and to also improve the user-friendliness for the testing engineer working with the test controller 20. The external testing device reads out and stores the coded failure data so that the reliability/testing engineer can analyze the N failure data.

Figure 2:
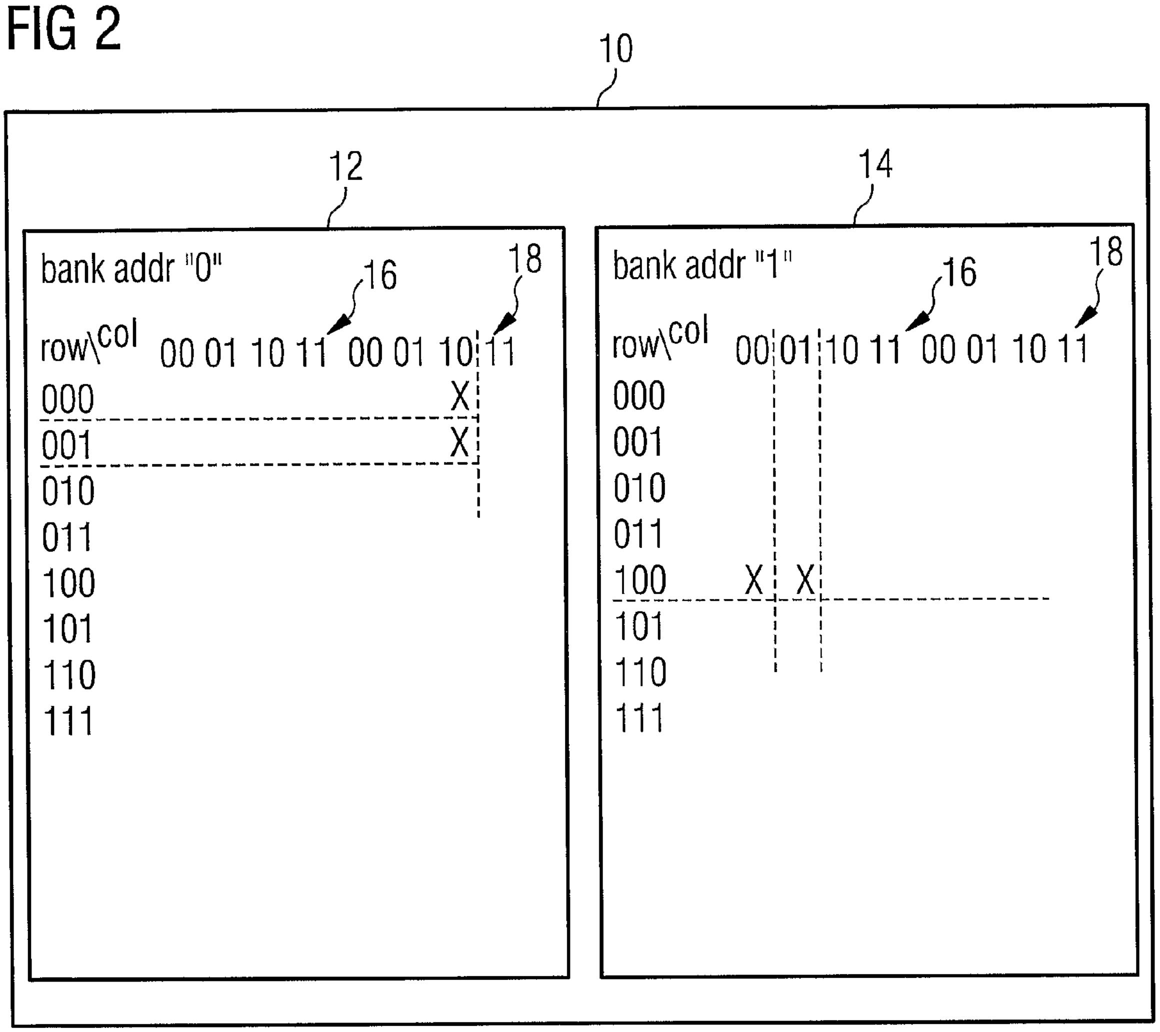
FIG. 2 illustrates a memory configuration with a failure pattern example.

By way of example, FIG. 2 illustrates a memory 10 which contains 64 words of two-bits each for a total of 128 bits. These bits are organized in arrays or banks 12 and 14. Each array has a number of rows and columns. Each bit of an array is accessed by applying a row address and a column address. In the example, three bits are used to access one of the eight rows and two bits are used to access one of the four groups of columns. Each bank is illustrated as arranged into two groups 16 and 18, each group having two groups of two columns (because words have two bits each). The bank address bit is used to select the bank to be accessed. Actual memories usually have many more rows and columns. The symbol 'X' in FIG. 2 indicates bits that appear to be defective after applying a test. In the first bank, Bank 0, the first two bits of column '10' of group 18 of Bank 0 are marked as defective. In the second bank, Bank 1, the first bits of the fifth row (row '100') are marked as defective.

Disclosed embodiments take advantage of the way many known memory test algorithms are applied. An algorithm is a sequence of read and write operations. Algorithms are often applied in a way that all bits in a row or a column group are accessed consecutively.

A general way of expressing algorithms is as follows:

For each test algorithm phase;
for each bank address;
For each row or column address;
For each column or row address;
For each operation;
Read and/or write data.

Typically, all words of the memory 10 are accessed during a phase of an algorithm. All memory locations are accessed several times during the execution of an algorithm.

Suppose that the memory 10 of FIG. 2 is to be tested and that the test is in a column access mode phase of the algorithm, Bank 0 is tested first, and that the row and column address changes from 0 to their respective maximum values.

In the first process, the test proceeds without problems in group 16 and columns '00' and '01' of group 18. However, in column '10', a first error is encountered. The controller stops and detailed failure information about this first failure is collected by reading the state of the controller contained in various registers. The failure information may include, for example, the algorithm phase, the bank/row/column address, the operation being executed, the failure bit location, the failure state, and the comparator(s) that reported a failure. In this specific example, the failure state is "C" (hex, testing controller algorithm "read 0"). The failure data is "000008" (hex), so the location where the failure occurs is the fourth bit. The failure bit location is "000100" (bin). The failure information for this first failure group is collected as follows:

Coded_Data [0:k]=[Failure Address; Failure Bit Location; Failure State]

and stored in line “0” of the failure data register 36 as can be seen best in FIG. 3.

Subsequent iterations of the test can resume from either where the previous iteration stopped or from the beginning of the phase or from the beginning of the algorithm—whatever is most appropriate. One of these options is selected and the test controller is initialized accordingly. It will noted that it is not always possible to resume from the point at which the failure occurred because some problems can only be found by applying a continuous sequence of read/write operations without interruption. Algorithm phases are not always self-contained in the sense that they might assume that the previous phase left the memory in a certain state and that state was changed by write operations during the partial execution of the current phase. Therefore, resuming from the beginning of a current phase is not always possible. However, it is always possible to resume from the beginning of the algorithm. For the remaining portion of this example, it will be assumed that a test is resumed from the beginning of the algorithm.

When the test is resumed, the failures detected in previous iterations can be ignored or masked in order to collect information about the next failure. Event counter 34 provides this function. The event counter 34 counts up to a predetermined number of masked events. These events are either failure events or success events, depending on the design of the controller. In this example, the event counter 34 is designed to count masked events which are failure events. Thus, the event counter 34 would count one failure event and then wait until the second failure event is detected before issuing an active freeze signal to general control block 24.

Alternatively, if the event counter is designed to count success events, the counter would be initialized to count seventeen “success” events and then wait until the second failure is detected. The seventeen success events are the events associated the 16 row addresses in columns ‘00’ and ‘01’ and the first row address of column ‘10’. The second failure is immediately detected in the second row address of column ‘10’. The failure information for this second failure is collected and stored in line “1” of the failure data register 36 as can be seen best in FIG. 3. For easier reference, failure bit locations and failure state identical to that of the first failure are chosen.

In a similar way, the third and fourth failure are detected in the fifth row address of columns ‘00’ and ‘01’. The failure information for this third and fourth failure is collected and stored in lines “2” and “3” of the failure data register 36 as can be seen in FIG. 3.

As soon as the number of detected failures reaches the maximum number N equal to the length of the failure data register 36, the HOLD criterion comes into play. Now, the N failure data set is written via the parallel failure data output 38 to an external testing device. The same applies at the end of the last testing phase when all memory cells are tested.

The method of collecting failure information will now be summarized with reference to FIG. 4.

FIG. 4 gives a rough overview of a method according to embodiments of the invention and FIG. 6 explains in greater detail which processes were performed in order to achieve the failure data register entries of FIG. 3 starting from the memory state according to FIG. 2.

According to the exemplary method illustrated in FIG. 4, for each failure group, the test controller 20 is initialized at process 50 to set the initial state of the test. As previously mentioned, the initial state can be the state at which the last failure occurred, the beginning of an algorithm phase, or the beginning of the algorithm itself. The initialization process also involves defining the number of failure events which will occur before applying the stopping criterion.

The memory test is applied at process 51 and involves applying a predetermined sequence of read and write operations according to a test algorithm, comparing memory output data to expected data and generating a failure signal when the memory output data does not correspond to the expected data.

If a failure data is detected at process 51, then the failure data becomes encoded at process 52 and stored in the failure data register set 36 at process 53.

At process 54, the controller 10 determines whether the failure data register set 36 is full, i.e. whether all N registers contain encoded failure entries. In this process, the event counter checks if the predetermined number of failures has been reached, i.e. whether the stopping criterion is satisfied.

If yes, the Hold mode of the general control block 24 is activated and the coded data in the data failure register is read out through the parallel failure data output. After process 55, the Hold mode of the general control block 24 is activated at process 56.

If the condition at process 54 is not fulfilled, i.e. the predetermined number of failures has not yet been reached, the processes 55 and 56 are skipped.

If the condition at process 51 is not fulfilled, i.e. the predetermined number of failures has not yet been reached, the processes 55 and 56 are skipped.

If no failure data is detected at process 51, then the processes 52-56 are skipped.

At process 57, the controller 10 determines whether all memory cells have been tested. If there are memory cells left for a failure test, then the process returns to process 51 above. Otherwise, the controller continues at process 58, where the content of the failure data register is read out via the parallel failure data output 38.

Figure 5:
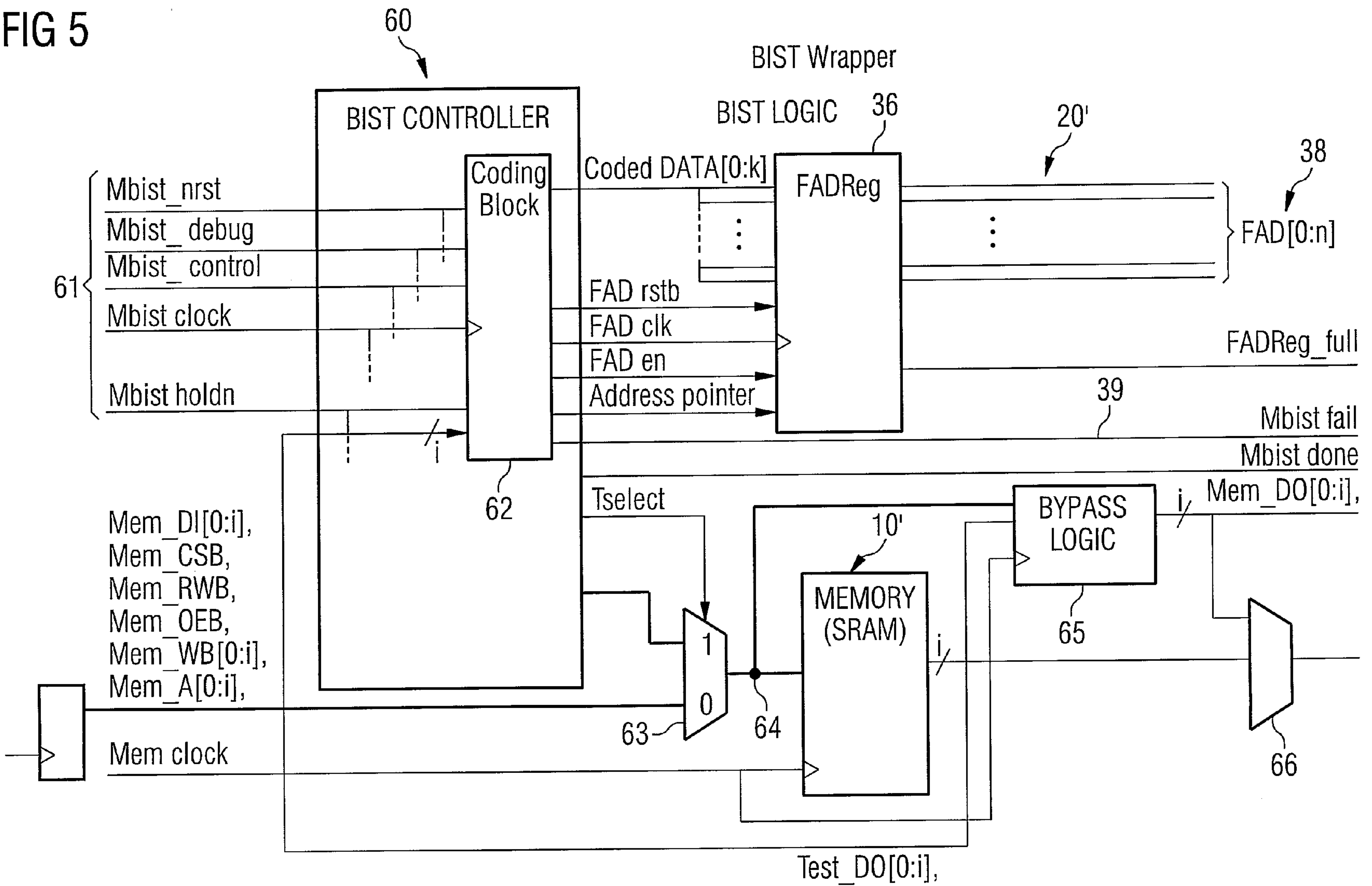
FIG. 5 illustrates a memory test controller architecture according to an embodiment of the present invention.

FIG. 5 illustrates an example of a memory test controller 20' architecture connected to an SRAM 10'. The memory test controller 20' and the SRAM memory 10' can be embedded in the same integrated circuit or the test controller 20' could reside off-chip. Not all functional connections of the test controller 20' to the SRAM memory 10' are illustrated in order to simplify FIG. 5. The memory test controller 20' can be shared among several SRAM memories 10'.

The memory test controller 20' is included of several blocks as illustrated in FIG. 5.

One of these blocks is a BIST controller 60 which interacts with some of the other blocks as well as with an external tester (not shown) either directly or through a test access port 61 as illustrated in FIG. 5. The test access port 61 includes one line Mbist_nrst, one line Mbist_debug, one line Mbist_control, one line Mbist_clock and one line Mbist_holdn.

The line Nbist_NRST is the line for initializing the BIST controller 60 by resetting the coding block 62. The line Mbist_ debug is a line for a control signal which activates the Debug mode of the coding block 62.

The line Mbist_control is a control signal line. This signal is used to activate the Mbist mode. The Mbist_clock line is a line for an Mbist clock signal which synchronizes the activities of the Mbist block respectively of the Mbist controller 60.

The line Mbist_holdn is a line for a control signal which—when activated—causes the Mbist controller 60 to go on hold and the FAD register 63 to write the data therein to the parallel failure data output lines 38.

In addition to the input lines as described above, there are several output lines provided in the Mbist controller 60. There is a multitude of lines “coded DATA (0:K)” provided. These lines are intended to transfer the failure data from the coding block 62 to the FAD register 36.

The line FAD_rstb transmits a reset signal for the FAD register 36. The line FAD_clock is a clock signal which synchronizes the co-operation of the components of the FAD register 36 with those of the BIST controller 60.

The line FAD_en transfers an enable signal for the components of the FAD register 36.

The line "address pointer" is a transmission line for a signal that states which address on the SRAM memory 10' refers to the failure data which is actually written to the FAD register 36.

The coding block 62 finally has an output line Mbist_fail. This line transmits a signal which tells the user that during the Mbist test mode there was a failure or that at least one FAD register 36 contains data for later evaluation. If the Mbist test is done with no error in the SRAM memory 10', then the Mbist controller 60 transmits a signal "Mbist_done" reflecting that. This signal can be used for certain applications when using the SRAM memory 10' in a device for operating that device. The user of the device then obtains a signal which indicates that the Mbist test is completed with no error. If the signal Mbist_fail is activated, the user can activate the debug mode of the ambist logic using the line Mbist_debug in the test access port 61.

In addition to the parallel failure data output lines 38, the FAD register 36 includes a line "FAD Reg_full" which gives an information as to whether in the FAD register 36 is full or not.

The BIST controller 60 has an additional line Tselect which selects the address of the SRAM memory 10' to be tested. Line Tselect is applied to a multiplexer 63 which receives on the other hand signals MEM_DI [0:i], MEM_CSB, MEM_RWB, MEM_OEB MEM_WIB [0:i], and MEM_A [A:j]. These signals are control signals, address data and data which is used for scanning the components around SRAM memory 10'. For this issue, in the scan mode, data coming from the BIST controller 60 and being directed to the SRAM memory 10'—such as read/write-control, test addresses, test data and other control signals—is generated by a unit (not displayed) outside of the BIST controller 60. This data is sent to the multiplexer 63 and from there to the SRAM memory 10'. At a junction 64, the signals from the multiplexer 63 are sent by a bypass line to the bypass logic 65. Bypass logic 65 detects whether or not the test data is used in the scan mode or in the BIST test mode. For this purpose, there is included an additional multiplexer 66 which evaluates and reflects whether the scan mode or the BIST test mode is invoked. Otherwise, the bypass logic 65 can have a initialization line (not shown) which can be used to access the same result.

Finally the SRAM memory 10' and the bypass logic 65 have a line mem_clock to synchronize the output at the line mem_DO [0:i].

According to the exemplary method illustrated in FIG. 6, for each failure group, the test controller 20' is initialized at process 100 via the line Mbist_nrst to reset the state of the BIST controller 38.

When beginning with the test of the SRAM memory 10', a test over the memory cells of the SRAM memory 10' is performed. If all memory cells pass this test, the line Mbist_done is changed to "high" from its initial state "low". This is called the "normal" MBIST test mode. In this MBIST test mode, the line Mbist_fail goes to "high" from its initial state "low" if there is at least one failure detected. In this case, the BIST controller 60 enters the MBIST Debug Mode as illustrated in FIG. 6.

The MBist debug mode is activated at process 110 via line MBist debug to get the detail of faulty information of the SRAM memory 10'. Once this debug mode is entered, the algorithms which are implemented in the BIST controller 60 is activated. For each output data of the memory, an XOR is performed with expected output data at process 111 (not shown in FIG. 5). The result of this operation is stored in the FAD_DO_position vector (not shown in FIG. 5). In this specific example, the memory output data is "0101011"/bin). The expected output data is "0101010" (bin). The FAD_DO_position vector will be equal to "1" (dec).

If the condition at process 112 is not fulfilled, i.e. the FAD_DO_position vector is different to "0" (dec), then the current output data contains at least one bit error.

If at least one failure data is detected at process 112, then at process 113, the fail signal 39 is activated to indicate the failure. Else at process 125, the fail signal 39 is deactivated when no failure data is detected at process 112.

If the condition at process 114 (following process 113) is fulfilled, i.e. the bit 0 of the FAD_DO_position vector is equal to zero, the process 115-121 are skipped. If not, at process 115 the failure information is coded (block 62 of FIG. 5) as follows:

Coded Data [0:k]=[failure address; failure bit location; failure state]

At process 116, the failure data register address pointer is incremented by one.

If the condition at process 117 is not fulfilled, i.e. the failure data register address pointer is equal to the maximum failure date (number N), then at process 118 the hold criterion comes into play. Now, the N failure data set is written via the parallel failure data output 38 to an external testing device.

Once the condition at process 119 is fulfilled then the N failure data transfer is completed. Then the failure date register address pointer is initialized (process 120).

If the condition at process 117 is fulfilled, i.e. the failure date register address pointer is lesser than the maximum failure date which can be stored inside the failure data register 36, the process 118-120 are skipped.

At process 121, the coded data is transferred inside the failure data register 36.

The FAD_DO_position counter is incremented by one at process 122. This counter is corresponding to the faulty data bit information.

If the condition at process 124 is not fulfilled, i.e. FAD_DO_position counter is equal to the data output bit size. In this case, every bits for this data output have been checked. Therefore, the BIST controller 38 reads the content of the following memory address 10, and so on (process 126).

If FAD_DO_position counter is lesser than the data output bit size then a right shift is performed on the FAD_DO_position at process 124. Performing this right shift will allow to verify the next FAD_DO_position bit. In this specific example, the current FAD_DO_position is "0000001" (bin). The current bit check is "1" (bin) ("000000$\underline{1}$"), and the new bit checks after the right shift will be "0" ($\overline{\text{bin}}$) ("000000$\underline{0}$).

These processes are repeated until the end of the $\overline{\text{M}}$Bist debug mode test is reached.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

The invention claimed is:

1. A method for operating an integrated circuit, comprising:

setting an initial state of a test;

defining a number N of failure events;

applying the test to the integrated circuit by applying a predetermined sequence of input and output operations according to a test algorithm;

comparing output data to expected data;

generating a failure signal when the output data does not correspond to the expected data;

if a failure signal is generated, storing failure data related to the failure event in a failure data register set embedded in the integrated circuit;

checking if the number N of failure events has been reached; and if the number of failure events N has been reached or if there are no more tests left, reading out the content of the failure data register set to an external testing device through a parallel failure data output port.

2. The method of claim 1, wherein setting the initial state of the test includes setting the integrated circuit to a state at which a failure occurred, the beginning of an algorithm phase, or the beginning of the test algorithm itself.

3. The method of claim 1, further comprising encoding the failure data before storing the failure data in the failure data register set.

4. The method of claim 1, wherein checking if the number N of failure events has been reached includes determining whether the failure data register set is full.

5. The method of claim 1, further comprising activating a hold mode of the integrated circuit before reading out the content of the data failure register set.

6. The method of claim 1, wherein reading out the contents of the failure data register set includes reading out failure data related to N failure events from N registers of the failure data register set.

7. The method of claim 6, wherein storing failure data related to the failure event includes storing an address of the failure, a phase of the test algorithm, and bit positions that generated the failure event.

8. An integrated circuit including a test controller, comprising:

a general control block for interaction with an external tester and for determining input and output operations that are to be performed with an integrated circuit under test;

an interaction block for communication with the integrated circuit under test;

an event counter adapted to count test events of the integrated circuit under test until a predetermined number (N) of failure events has been reached;

a failure data register set for receiving a number of failure data corresponding to the failure events, the failure data register set having a parallel failure data output port for writing the content of the failure data register set to an external testing device when the predetermined number (N) of failure events has been reached.

9. The integrated circuit of claim 8, wherein the interaction block includes a R/W control block, an address generator block, a data generator block, and a comparator block (26) for communication with the integrated circuit under test, the integrated circuit under test being a semiconductor memory, and wherein the event counter receives a failure signal from the comparator block when a failure event occurs.

10. The integrated circuit of claim 8, wherein the integrated circuit under test is a semiconductor memory, and wherein the test controller, is an on-chip test controller coupled to the semiconductor memory.

11. A non-transitory medium storing a computer program that when executed performs a method comprising:

setting an initial state of a test;

defining a number N of failure events;

applying the test to an integrated circuit by applying a predetermined sequence of input and output operations according to a test algorithm;

comparing output data to expected data;

generating a failure signal when the output data does not correspond to the expected data;

if a failure signal is generated, storing failure data related to the failure event in a failure data register set embedded in the integrated circuit;

checking if the number N of failure events has been reached; and if the number of failure events N has been reached or if there are no more tests left, reading out the content of the failure data register set to an external testing device through a parallel failure data output port.

* * * * *